(12) United States Patent
Baek et al.

(10) Patent No.: US 10,459,794 B2
(45) Date of Patent: Oct. 29, 2019

(54) MEMORY SYSTEMS HAVING EXTENDED PRODUCT LIFETIME AND METHODS OF OPERATING THE SAME

(71) Applicant: SK hynix Inc., Icheon-si, Gyeonggi-do (KR)

(72) Inventors: Jinho Baek, Icheon-si (KR); Il Park, Suwon-si (KR); Da Eun Song, Suwon-si (KR); Hokyoon Lee, Icheon-si (KR); Youngpyo Joo, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/821,493

(22) Filed: Nov. 22, 2017

(65) Prior Publication Data

US 2018/0225173 A1   Aug. 9, 2018

(30) Foreign Application Priority Data

Feb. 6, 2017 (KR) .......................... 10-2017-0016451

(51) Int. Cl.
*G06F 11/10* (2006.01)
*G11C 29/52* (2006.01)
*G11C 29/04* (2006.01)

(52) U.S. Cl.
CPC ........ *G06F 11/108* (2013.01); *G06F 11/1048* (2013.01); *G06F 11/1068* (2013.01); *G11C 29/52* (2013.01); *G11C 2029/0411* (2013.01)

(58) Field of Classification Search
CPC ............................ G06F 11/108; G06F 11/1068
See application file for complete search history.

(56) References Cited

U.S. PATENT DOCUMENTS

| 5,402,428 | A | * | 3/1995 | Kakuta | ................. | G06F 3/0601 |
|---|---|---|---|---|---|---|
| | | | | | | 711/114 |
| 2004/0255225 | A1 | * | 12/2004 | Takai | .................. | G06F 11/1068 |
| | | | | | | 714/763 |
| 2010/0125695 | A1 | * | 5/2010 | Wu | ........................ | G06F 3/0613 |
| | | | | | | 711/103 |
| 2012/0324156 | A1 | * | 12/2012 | Muralimanohar | .. | G06F 11/1044 |
| | | | | | | 711/104 |
| 2013/0067138 | A1 | * | 3/2013 | Schuette | ............... | G06F 3/0616 |
| | | | | | | 711/103 |
| 2016/0246519 | A1 | * | 8/2016 | McKean | ............... | G06F 3/0611 |

FOREIGN PATENT DOCUMENTS

| KR | 1020060092139 A | 8/2006 |
|---|---|---|
| KR | 1020140067819 A | 6/2014 |

* cited by examiner

*Primary Examiner* — Joseph D Torres
(74) *Attorney, Agent, or Firm* — William Park & Associates Ltd.

(57) ABSTRACT

A memory system includes a first memory device, a second memory device, and a controller. The second memory device has a write endurance which is higher than a write endurance of the first memory device. The controller performs an error correction process on original data outputted from a host to generate a codeword including the original data and parity data. The controller separates the codeword into the original data and the parity data to write the separated original data into the first memory device and to write the separated parity data into the second memory device.

6 Claims, 16 Drawing Sheets

MEMORY SYSTEMS HAVING EXTENDED PRODUCT LIFETIME AND METHODS OF OPERATING THE SAME

CROSS-REFERENCE TO RELATED APPLICATIONS

The present application claims priority under 35 U.S.C 119(a) to Korean Application No. 10-2017-0016451, filed on Feb. 6, 2017, which is herein incorporated by reference in its entirety.

BACKGROUND

1. Technical Field

Various embodiments of the present disclosure generally relate to memory systems and methods of operating the same and, more particularly, to memory systems having extended product lifetime and methods of operating the memory systems.

2. Related Art

Nonvolatile memory (NVM) devices such as ferroelectric random access memory (FRAM) devices, magnetic RAM (MRAM) devices, phase change RAM (PRAM) devices, or the like are very attractive as the next generation of memory devices. This is because the FRAM devices, the MRAM device, the PRAM devices or the like may exhibit a low power consumption characteristic and may access their memory cells in units of bytes with nonvolatile memory characteristics. Although NAND-type flash memory devices are widely used as a nonvolatile memory device, the NAND-type flash memory devices may have some disadvantages in that a read operation and a write operation are achieved in units of pages and an erasure operation is performed in units of blocks. Accordingly, nonvolatile memory devices which are capable of performing a read operation and a write operation in units of bytes are increasingly in demand. However, the nonvolatile memory devices may generally exhibit a poor write endurance (corresponding to the maximum number of times that a datum can be repeatedly written into the same memory cell without error), as compared with volatile memory devices. Thus, it is well known in the art that a product lifetime of nonvolatile memory devices is relatively shorter than a product lifetime of volatile memory devices. For example, while dynamic random access memory (DRAM) devices corresponding to typical volatile memory devices exhibit a write endurance of about $10^{15}$, the PRAM devices generally exhibit a write endurance of about $10^8$, and the RRAM devices generally exhibit a write endurance of about $10^5$. Thus, a wear-leveling technique or a data inverting technique has been applied to the nonvolatile memory devices to improve the write endurance.

Meanwhile, in case of the nonvolatile memory devices such as the PRAM devices or the RRAM devices, a read margin for sensing a difference between a datum "0" and a datum "1" may be relatively narrow due to the nature of cells thereof. Thus, the nonvolatile memory devices such as the PRAM devices or the RRAM devices may exhibit a relatively high error rate as compared with the NAND-type flash memory devices, even though a single level cell (SLC) structure is employed in the nonvolatile memory devices. Accordingly, it may be necessary to employ an ECC scheme in the nonvolatile memory devices including the PRAM devices or the MRAM devices. If original data are written in the nonvolatile memory devices using the ECC scheme, parity bits in addition to the original data may also be written into the nonvolatile memory devices for error correction. If an overwrite rate of the original data is lower than 50%, an overwrite rate of the parity bits may be relatively higher than that of the original data. In such a case, the lifetime of the nonvolatile memory devices may be reduced.

SUMMARY

Various embodiments are directed to memory systems having extended product lifetime and methods of operating the memory systems.

According to an embodiment, a memory system includes a first memory device, a second memory device, and a controller. The second memory device has a write endurance which is higher than a write endurance of the first memory device. The controller performs an error correction process on original data outputted from a host to generate a codeword including the original data and parity data. The controller separates the codeword into the original data and the parity data to write the separated original data into the first memory device and to write the separated parity data into the second memory device.

According to another embodiment, a memory system includes a first memory device, a second memory device, and a controller. The second memory device has a write endurance which is higher than a write endurance of the first memory device. The controller performs an error correction process and a data inversion process of original data outputted from a host to generate a binary data stream including the original data and metadata. The controller separates the binary data stream into the original data and the metadata to write the separated original data into the first memory device and to write the separated metadata into the second memory device.

According to another embodiment, there is provided a method of operating a memory system. The method includes performing an error correction process of original data outputted from a host to generate a codeword including the original data and parity data added to the original data. The codeword is separated into the original data and the parity data. The separated original data is written into a first memory device, and the separated parity data is written into a second memory device having a write endurance which is higher than a write endurance of the first memory device.

According to another embodiment, there is provided a method of operating a memory system. The method includes performing an error correction process of original data outputted from a host to generate a codeword including the original data and parity data added to the original data, inverting or non-inverting all bit data included in the codeword to generate a binary data stream comprised of the codeword and inversion status data having information on whether the codeword is inverted data, and separating the binary data stream into the original data and metadata to write the separated original data into a first memory device and to write the separated metadata into a second memory device having a write endurance which is higher than a write endurance of the first memory device. The metadata includes the parity data and the inversion status data.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under", or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below", and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
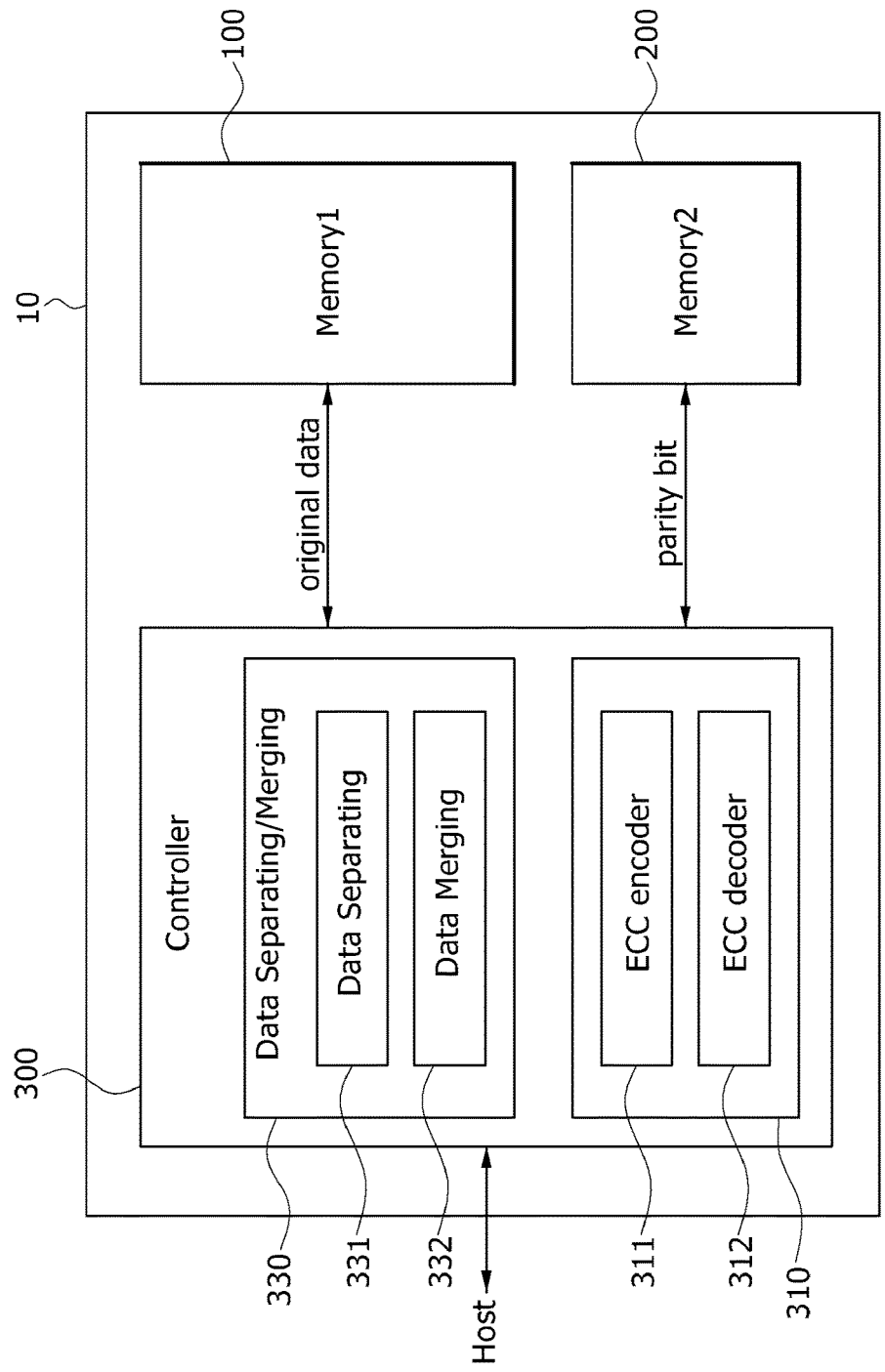
FIG. 1 is a block diagram illustrating a memory system according to an embodiment of the present disclosure.

FIG. 1 is a block diagram illustrating a memory system 10 according to an embodiment of the present disclosure. Referring to FIG. 1, the memory system 10 may be configured to include a first memory device 100, a second memory device 200, and a controller 300. In some embodiments, the first memory device 100 may be a nonvolatile memory. For example, the first memory device 100 may be a PRAM device, an MRAM device, a resistive RAM (RRAM) device, a nano floating gate memory (NFGM) device, or a polymer RAM device, and the second memory device 200 may be another nonvolatile memory device having a write endurance which is higher than a write endurance of the first memory device 100. Alternatively, the first memory device 100 may be a nonvolatile memory device, and the second memory device 200 may be a volatile memory device having a write endurance which is higher than a write endurance of the first memory device 100. In an embodiment, the first memory device 100 may be a PRAM device, an MRAM device, an RRAM device, an NFGM device, or a polymer RAM device, and the second memory device 200 may be a DRAM device.

The controller 300 may receive a write command or a read command from a host to perform a write operation for writing data into the first memory device 100 or a read operation for reading out data stored in the first memory device 100. The controller 300 may include an error correction part 310 for correcting data errors and a data separating/merging part 330 for separating or merging data to perform the read operation or the write operation. The error correction part 310 may be configured to include an error correction code (ECC) encoder 311 performing an ECC encoding operation of data inputted to the ECC encoder 311 and an ECC decoder 312 performing an ECC decoding operation of data inputted to the ECC decoder 312. The data separating/merging part 330 may include a data separating part 331 separating data into two portions and a data merging part 332 merging two separate data.

If original data are inputted to the controller 300 by a write command outputted from the host, the ECC encoder 311 of the error correction part 310 may perform an error correction process including an ECC encoding operation on the original data inputted to the ECC encoder 311 during a write operation to generate and output a codeword including the original data and parity data. The codeword outputted from the ECC encoder 311 may be separated into the original data and the parity data by the data separating/merging part 330. The original data and the parity data separated by the data separating/merging part 330 may be respectively written into the first memory device 100 and the second memory device 200 by the controller 300.

The controller 300 may read out the original data stored in the first memory device 100 and the parity data stored in the second memory device 200 in response to a read command outputted from the host. The original data and the parity data transmitted from the first and second memories 100 and 200 to the controller 300 may be merged by the data separating/merging part 330 to provide a codeword-type data stream, and the ECC decoder 312 of the error correction part 310 may perform an ECC decoding operation of the codeword-type data stream inputted to the ECC decoder 312 during a read operation to restore and correct the codeword-type data stream to the original data. The original data restored and corrected by the ECC decoder 312 may be transmitted to the host.

Figure 2:
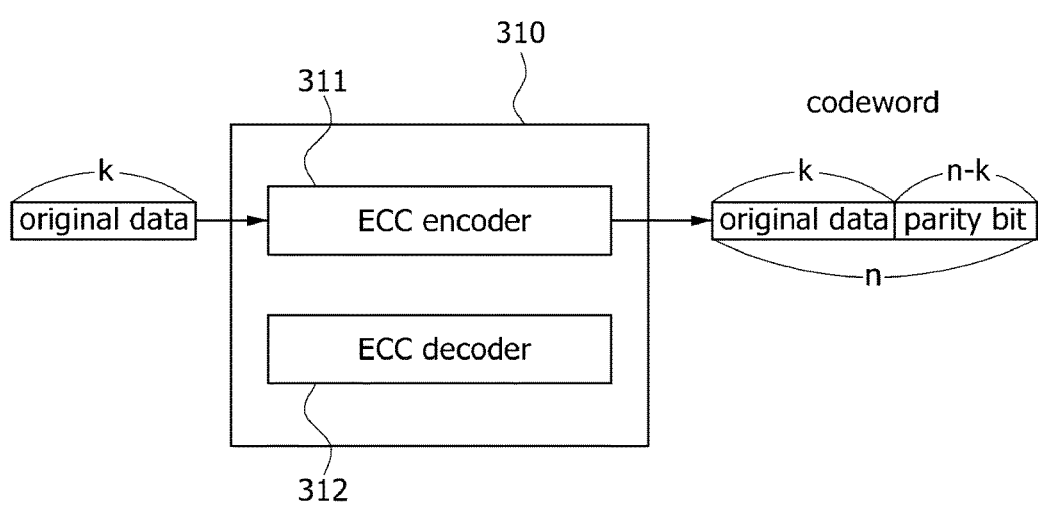
FIG. 2 is a schematic view illustrating operation of an error correction part included in the memory system of FIG. 1 during a write operation.
Figure 3:
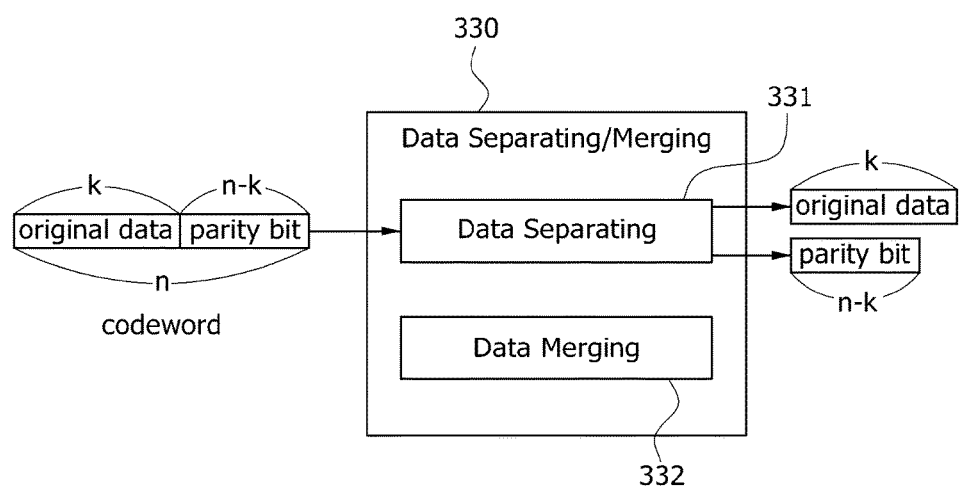
FIG. 3 is a schematic view illustrating operation of a data separating/merging part included in the memory system of FIG. 1 during a write operation.

FIGS. 2 and 3 are schematic views illustrating a write operation of the memory system 10 shown in FIG. 1. Specifically, FIG. 2 is a schematic view illustrating an operation of the error correction part 310 during a write operation, where the error correction part 310 may be included in the memory system 10. FIG. 3 is a schematic view illustrating an operation of the data separating/merging part 330 during a write operation, where the data separating/merging part 330 may be included in the memory system 10. First, referring to FIGS. 1 and 2, the original data having "k"-number of bits (also, referred to as "k"-bit original data) transmitted to the controller 300 with a write command and address information may be inputted to the ECC encoder 311 of the error correction part 310. The ECC encoder 311 may perform an ECC encoding operation of the "k"-bit original data to generate and output the codeword having "n"-number of bits (also, referred to as a "n"-bit codeword). The number "n" of bits included in the codeword may be greater than the number "k" of bits included in the original data. The "n"-bit codeword may be configured to include the "k"-bit original data and the "(n−k)"-bit parity data. The "(n−k)"-bit parity data may be used to find locations of erroneous bits and to correct the erroneous bits while a subsequent ECC decoding operation is performed.

Next, referring to FIGS. 1 and 3, the "n"-bit codeword outputted from the ECC encoder 311 may be inputted to the data separating part 331 of the data separating/merging part 330. The data separating part 331 may separate the "n"-bit codeword into the "k"-bit original data and the "(n−k)"-bit parity data. As described with reference to FIG. 1, the controller 300 may store the "k"-bit original data in the first memory device 100 and may store the "(n−k)"-bit parity data in the second memory device 200. After the "k"-bit original data and the "(n−k)"-bit parity data are respectively stored in the first memory device 100 and the second memory device 200, the controller 300 may update an address map in the controller 300 to set up a link between an address of the "k"-bit original data stored in the first memory device 100 and an address of the "(n−k)"-bit parity data stored in the second memory device 200. This is for correctly merging the "k"-bit original data and the "(n−k)"-bit parity data during a subsequent read operation.

Figure 4:
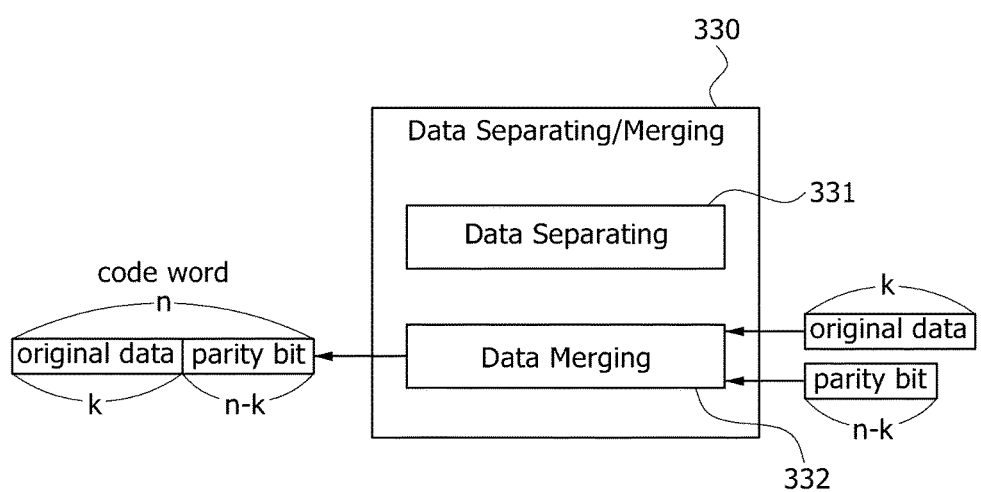
FIG. 4 is a schematic view illustrating operation of the data separating/merging part included in the memory system of FIG. 1 during a read operation.
Figure 5:
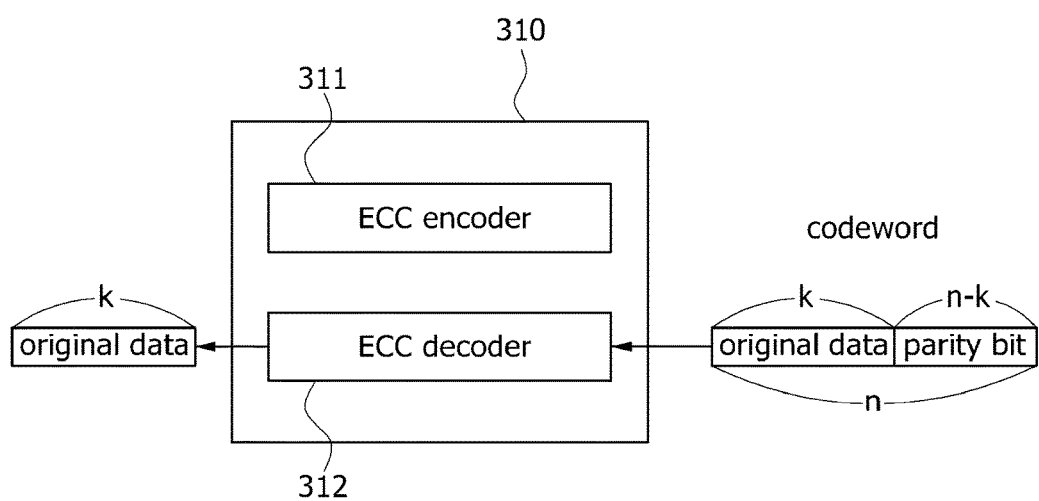
FIG. 5 is a schematic view illustrating an operation of the error correction part included in the memory system of FIG. 1 during a read operation.

FIGS. 4 and 5 are schematic views illustrating a read operation of the memory system 10 shown in FIG. 1. Specifically, FIG. 4 is a schematic view illustrating an operation of the data separating/merging part 330 during a read operation, where the data separating/merging part 330 may be included in the memory system 10. FIG. 5 is a schematic view illustrating an operation of the error correction part 310 during the read operation, where the error correction part 310 may be included in the memory system 10. First, referring to FIGS. 1 and 4, if a read command and address information are inputted to the controller 300, the controller 300 may read out the original data stored in the first memory device 100 and may read out the parity data stored in the second memory device 200. The original data read out of the first memory device 100 may be transmitted to the data merging part 332, and the parity data read out of the second memory device 200 may also be transmitted to the data merging part 332. The controller 300 may correctly read the original data and the parity data out of the first and second memories 100 and 200 using the updated address map including the linked addresses of the original data and the parity data that constitute the codeword which is generated during the previous write operation. The data merging part 332 may merge the original data and the parity data to generate and output an "n"-bit merged codeword. Accordingly, the "n"-bit merged codeword outputted from the data merging part 332 may include the original data and the parity data.

Next, referring to FIGS. 1 and 5, the "n"-bit codeword outputted from the data merging part 332 may be inputted to the ECC decoder 312 of the error correction part 310. The ECC decoder 312 may perform an ECC decoding operation of the "n"-bit codeword to correct erroneous bits of the "n"-bit codeword and may output the "k"-bit original data of the corrected codeword. The "k"-bit original data outputted from the ECC decoder 312 may be transmitted to the host through a host interface.

In the memory system 10 described above, the parity data added to the original data during the ECC encoding operation may be separated from the original data during the ECC decoding operation for error correction, and the separate parity data may be stored in the second memory device 200 having a write endurance which is higher than a write endurance of the first memory device 100. As an example, if some bits corresponding to at most 25% of all of the bits of the previous original data stored in the first memory device 100 are overwritten with original data of a new codeword, some bits corresponding to at least 75% of all the bits of the previous parity data stored in the second memory device 200 may be overwritten with parity data of the new codeword. In such a case, because the new parity data having an overwrite rate higher than an overwrite rate of the new original data are stored in the second memory device 200 having a write endurance which is higher than a write endurance of the first memory device 100, degradation of the lifetime of the first memory device 100 may be suppressed.

Figure 6:
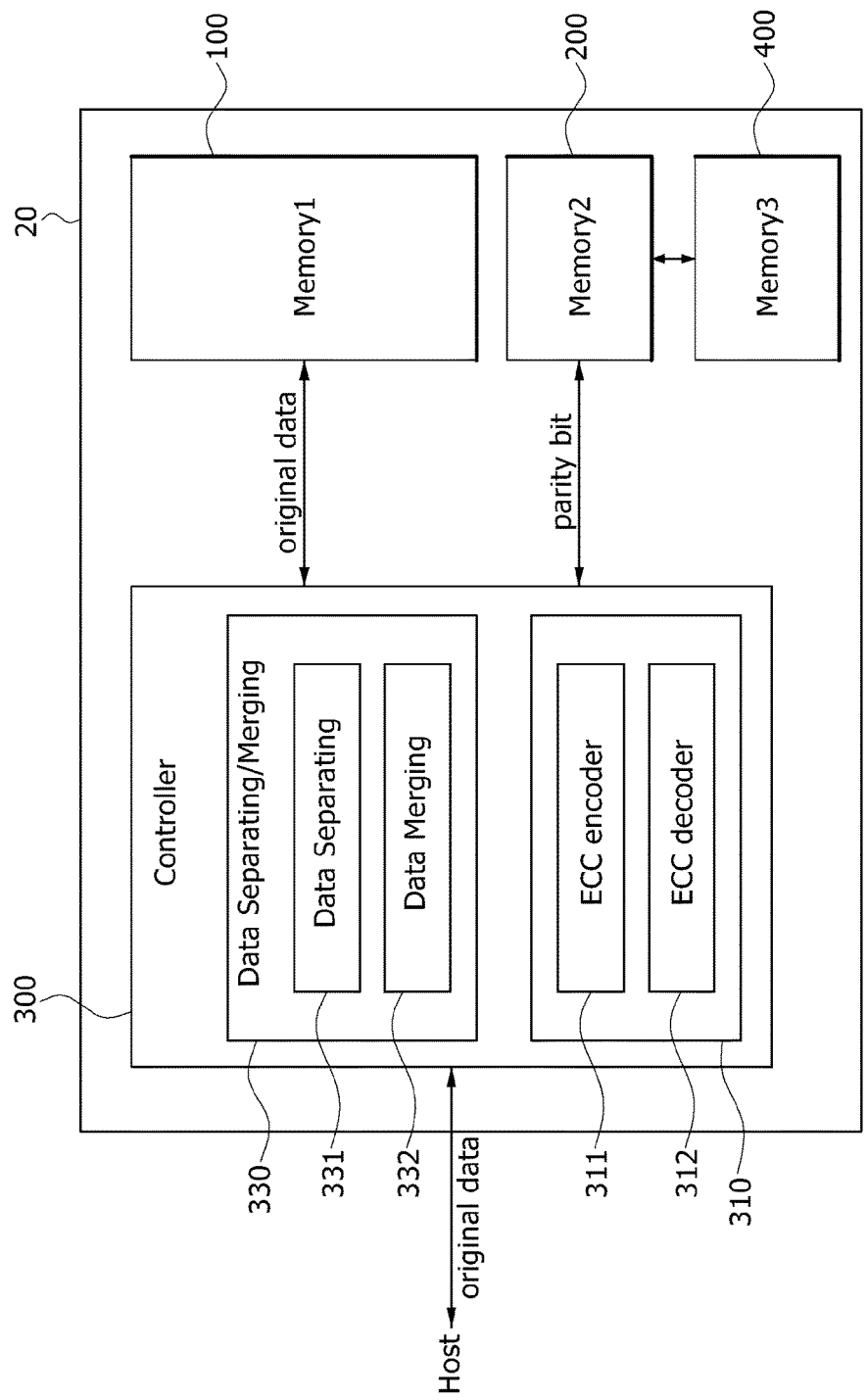
FIG. 6 is a block diagram illustrating a memory system according to another embodiment of the present disclosure.

FIG. 6 is a block diagram illustrating a memory system 20 according to another embodiment of the present disclosure. In FIG. 6, the same reference numerals as used in FIG. 1 denote the same elements. Thus, to avoid duplicate explanation, description of the same elements as illustrated in FIG. 1 will be omitted or only briefly mentioned hereinafter. Referring to FIG. 6, the memory system 20 may be configured to further include a third memory device 400 as compared with the memory system 10. The third memory device 400 may be realized using a nonvolatile memory device. The third memory device 400 may be used as a backup storage device of the parity data stored in the second memory device 200. If the second memory device 200 is a volatile memory device, all of the parity data stored in the second memory device 200 may be lost when its power supply is interrupted. In the event that the memory system 20 is employed in a data server system, power supply may be almost always applied to the data server system. However, sometimes power supply of the data server system may be interrupted. In such a case, the controller 300 may write all of the parity data stored in the second memory device 200 into the third memory device 400 before the parity data stored in the second memory device 200 is lost. Because the third memory device 400 is a nonvolatile memory device, the parity data written into the third memory device 400 may be retained even though the power supply is interrupted. If the power supply is applied to the memory system 20 again, the controller 300 may rewrite the parity data stored in the third memory device 400 into the second memory device 200.

Figure 7:
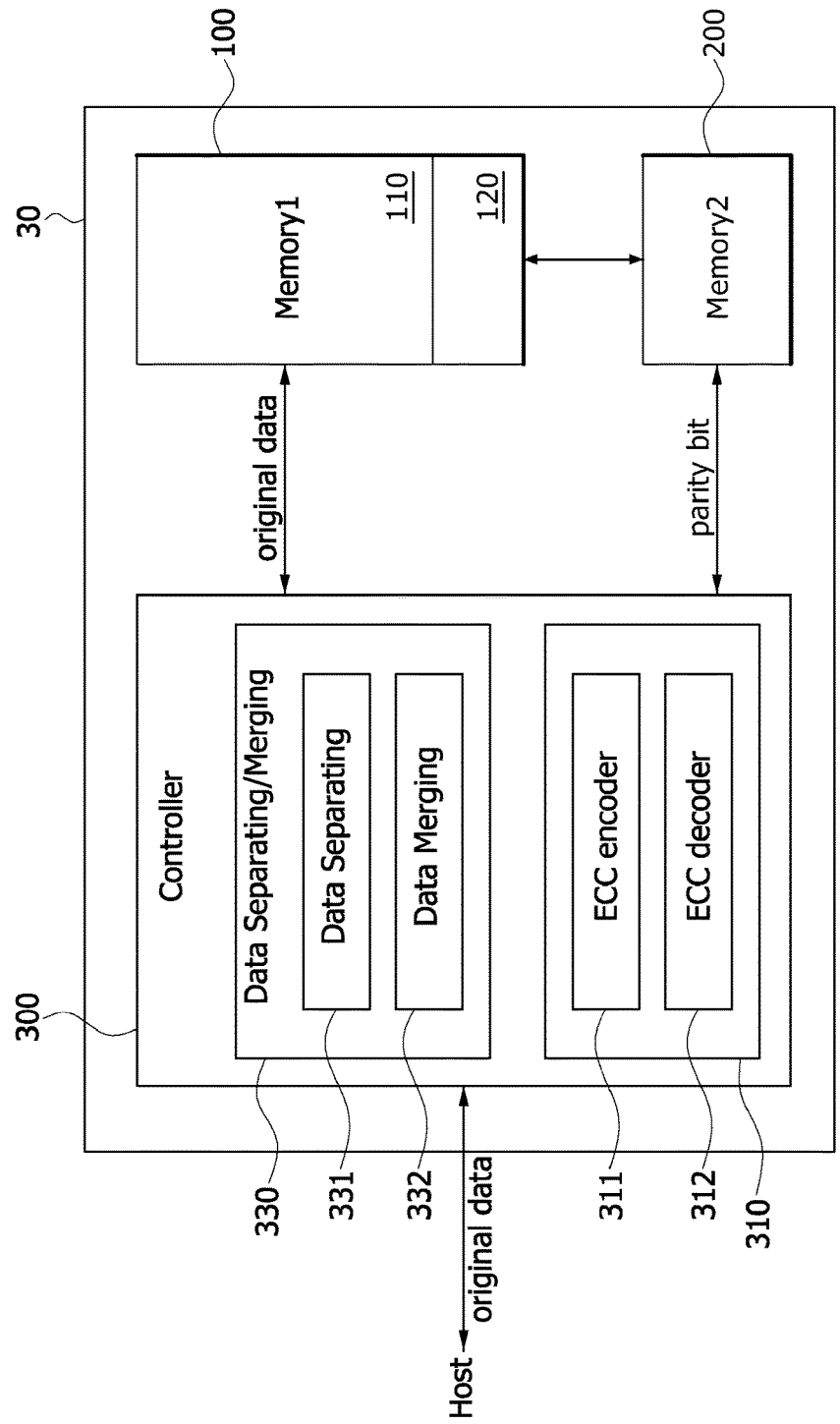
FIG. 7 is a block diagram illustrating a memory system according to yet another embodiment of the present disclosure.

FIG. 7 is a block diagram illustrating a memory system 30 according to yet another embodiment of the present disclosure. In FIG. 7, the same reference numerals as used in FIG. 1 denote the same elements. Thus, to avoid duplicate explanation, description of the same elements as illustrated in FIG. 1 will be omitted or only briefly mentioned hereinafter.

Referring to FIG. 7, in the memory system 30, an entire portion of the first memory device 100 may be divided into a data storage region 110 and a backup region 120. Original data may be stored in the data storage region 110. If power supply applied to the memory system 30 is interrupted, parity data stored in the second memory device 200 may be written into the backup region 120 of the first memory device 100. If power supply is applied to the memory system 30 again, the parity data stored in the backup region 120 may be rewritten into the second memory device 200.

Figure 8:
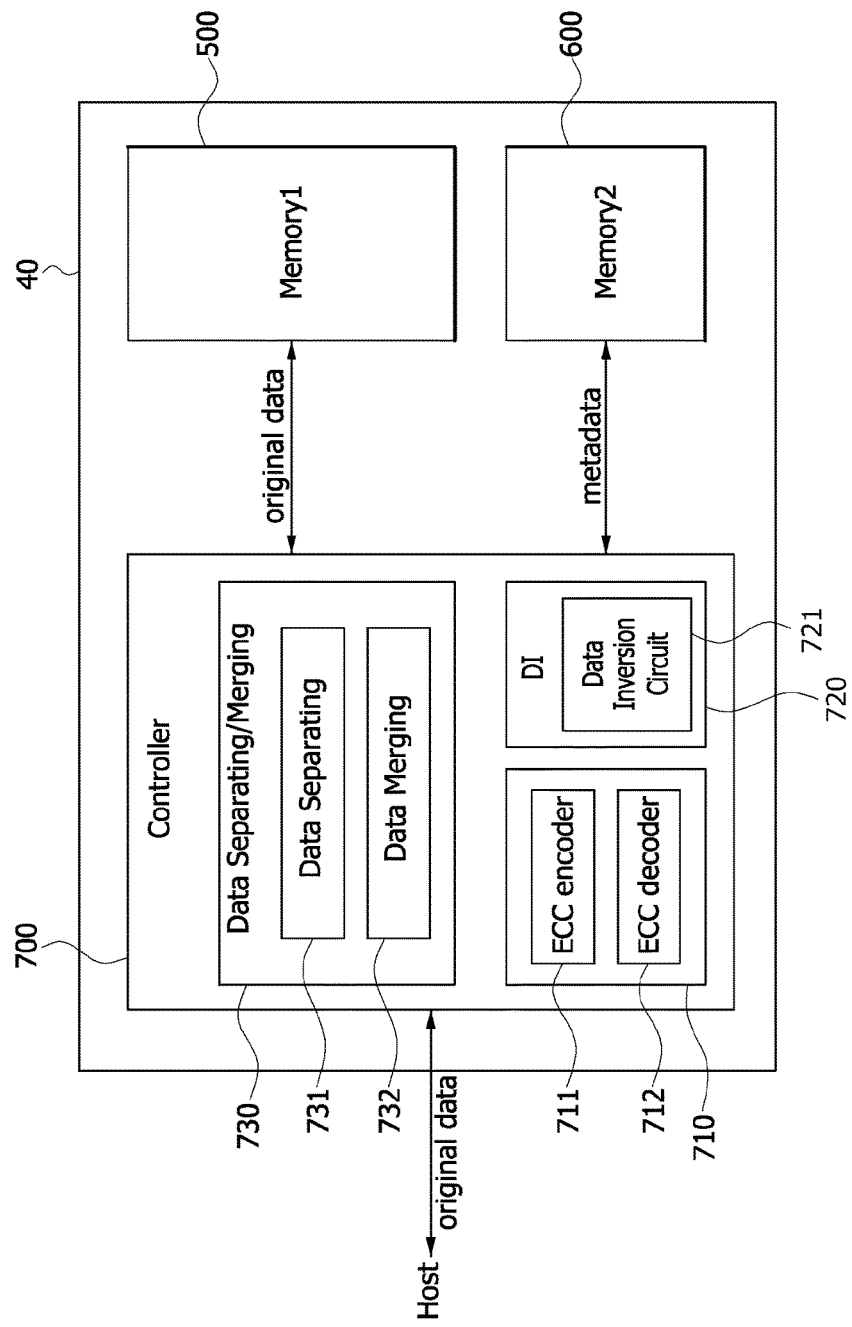
FIG. 8 is a block diagram illustrating a memory system according to still another embodiment of the present disclosure.

FIG. 8 is a block diagram illustrating a memory system 40 according to still another embodiment of the present disclosure. Referring to FIG. 8, the memory system 40 may be configured to include a first memory device 500, a second memory device 600, and a controller 700. In some embodiments, the first memory device 500 may be a nonvolatile memory. For example, the first memory device 500 may be a PRAM device, an MRAM device, an RRAM device, an NFGM device, or a polymer RAM device, and the second memory device 600 may be another nonvolatile memory device having a write endurance which is higher than a write endurance of the first memory device 500. Alternatively, the first memory device 500 may be a nonvolatile memory device, and the second memory device 600 may be a volatile memory device having a write endurance which is higher than a write endurance of the first memory device 500. In an embodiment, the first memory device 500 may be a PRAM device, an MRAM device, an RRAM device, an NFGM device, or a polymer RAM device, and the second memory device 600 may be a DRAM device.

The controller 700 may receive a write command or a read command from a host to perform a write operation for writing data into the first memory device 500 or a read operation for reading out data stored in the first memory device 500. The controller 700 may include an error correction part 710 for correcting data errors, a data inversion part 720 for inverting data, and a data separating/merging part 730 for separating or merging data to perform the read operation or the write operation.

The error correction part 710 may be configured to include an ECC encoder 711 performing an ECC encoding operation of data inputted to the ECC encoder 711, and an ECC decoder 712 performing an ECC decoding operation of data inputted to the ECC decoder 712. The data inversion part 720 may include a data inversion circuit 721 that inverts data inputted to the data inversion part 720 under a certain condition and outputs the inverted data. The data separating/merging part 730 may include a data separating part 731 for separating data into two portions, and a data merging part 732 for merging two separate data.

If original data are inputted to the controller 700 by a write command outputted from the host, the ECC encoder 711 of the error correction part 710 may perform an error correction process including an ECC encoding operation of the original data and the data inversion part 720 may perform a data inversion process including comparing the number of bits to be overwritten with the encoded original data and the number of bits not to be overwritten with the encoded original data. The data inversion part 720 may invert all of the data of bits included in the input data to output the inverted data or may output the input data without inverting any of the data of bits included in the input data, according to the comparison result of the data inversion part 720. After the ECC encoding operation and the data inversion operation are performed, metadata may be added to the original data. The metadata may include parity data generated by the ECC encoding operation and inversion status data generated by the data inversion operation. A binary data stream outputted from the data inversion part 720 may be separated into the original data and the metadata by the data separating/merging part 730. The controller 700 may write the separated original data into the first memory device 500 and may write the separated metadata into the second memory device 600.

The controller 700 may read out the original data and the metadata stored in the first and second memory devices 500 and 600 according to a read command outputted from the host. The original data and the metadata inputted to the controller 700 may be merged by the data separating/merging part 730 to generate a merged binary data stream. The merged binary data stream may be restored by the data inversion part 720 and the data correction part 710 to provide restored original data, and the restored original data may be transmitted to the host.

Figure 9:
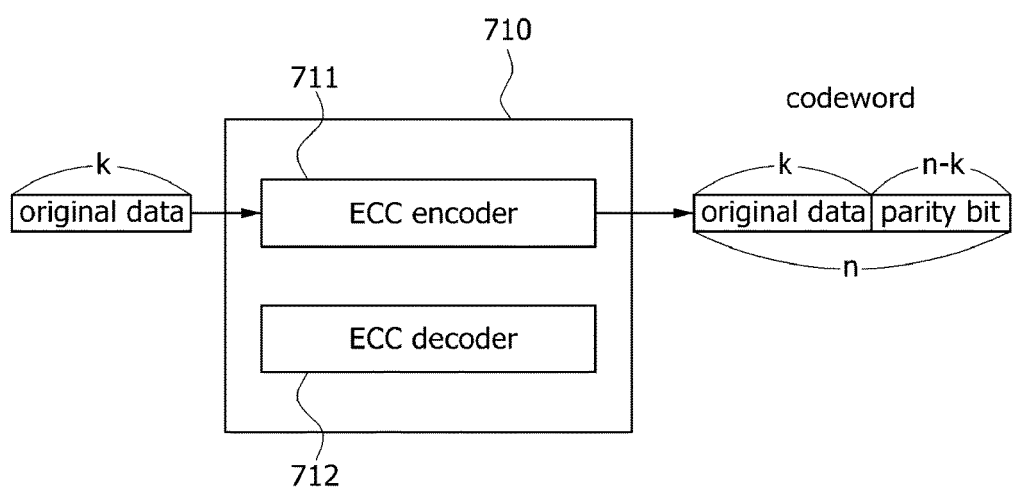
FIG. 9 is a schematic view illustrating operation of an error correction part included in the memory system of FIG. 8 during a write operation.
Figure 10:
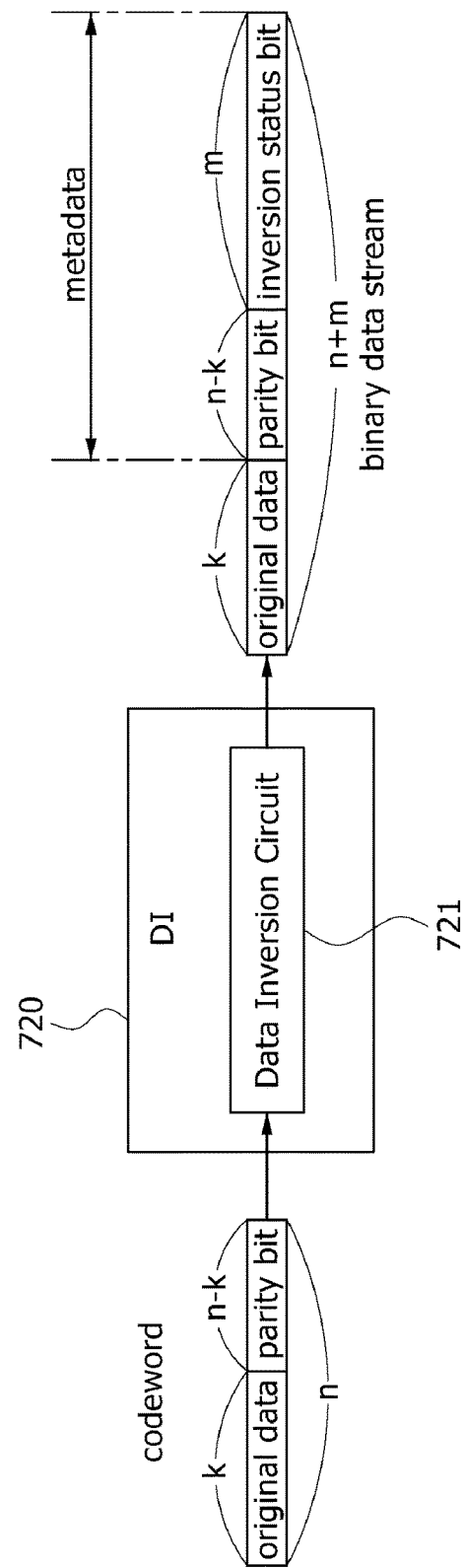
FIG. 10 is a schematic view illustrating operation of a data inversion part included in the memory system of FIG. 8 during a write operation.
Figure 11:
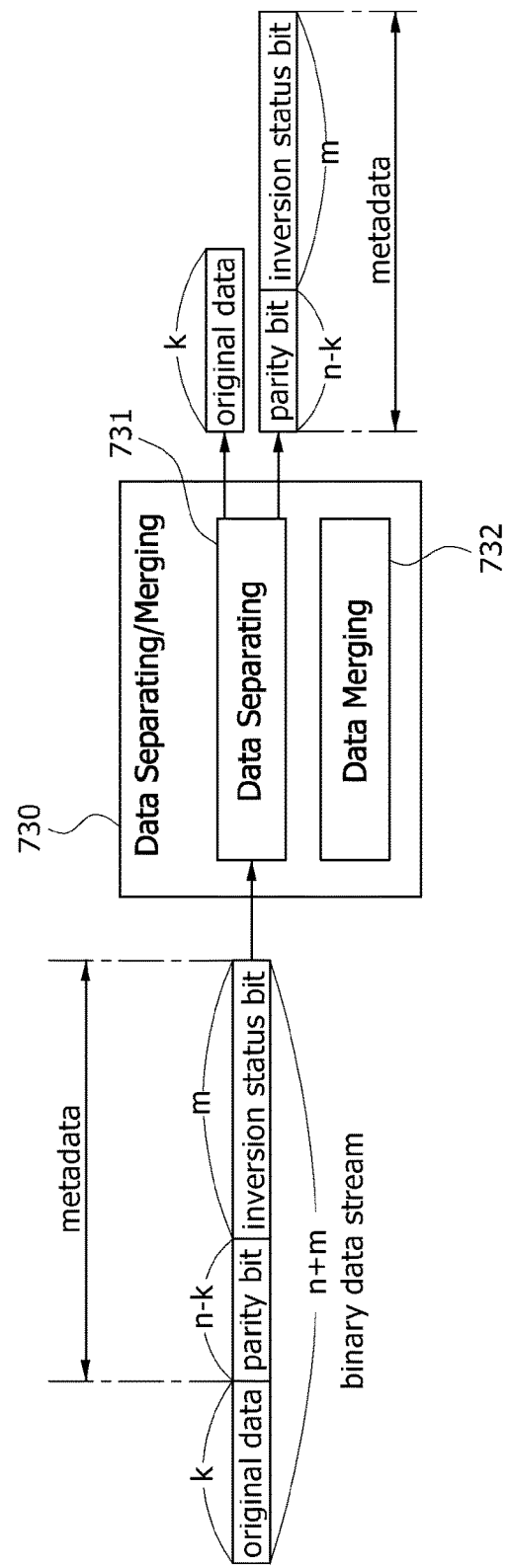
FIG. 11 is a schematic view illustrating operation of a data separating/merging part included in the memory system of FIG. 8 during a write operation.

FIGS. 9, 10, and 11 are schematic views illustrating a write operation of the memory system 40 shown in FIG. 8. Specifically, FIG. 9 is a schematic view illustrating an operation of the error correction part 710 included in the memory system 40 during the write operation, FIG. 10 is a schematic view illustrating an operation of the data inversion part 720 included in the memory system 40 during the write operation, and FIG. 11 is a schematic view illustrating an operation of the data separating/merging part 730 included in the memory system 40 during the write operation. First, referring to FIGS. 8 and 9, the original data having "k"-number of bits (also, referred to as "k"-bit original data) transmitted to the controller 700 with a write command and address information may be inputted to the ECC encoder 711 of the error correction part 710. The ECC encoder 711 may perform an ECC encoding operation of the "k"-bit original data to generate and output a codeword having "n"-number of bits (also, referred to as a "n"-bit codeword). The number "n" of bits included in the codeword may be greater than the number "k" of bits included in the original data. The "n"-bit codeword may be configured to include the "k"-bit original data and the "(n–k)"-bit parity data. The "(n–k)"-bit parity data may be used to find locations of erroneous bits and to correct the erroneous bits while a subsequent ECC decoding operation is performed.

Next, referring to FIGS. 8 and 10, the "n"-bit codeword outputted from the ECC encoder 711 may be inputted to the data inversion part 720. The controller 700, in one example the data inversion circuit 721 of the controller 700, may compare the "k"-bit original data of the "n"-bit codeword with previous data stored in a region of the first memory device 500 corresponding to an address of the "k"-bit original data. If the number of bits of the previous data to be overwritten with the "k"-bit original data is greater than the number of bits of the previous data not to be overwritten with the "k"-bit original data, a data inversion control signal may be inputted to the data inversion circuit 721 of the data inversion part 720. In such a case, the data inversion circuit 721 may invert all of the bit data included in the codeword and may output the inverted data of the codeword, in response to the data inversion control signal. In contrast, if the number of bits of the previous data to be overwritten with the "k"-bit original data is less than the number of bits of the previous data not to be overwritten with the "k"-bit original data, a data noninversion control signal may be inputted to the data inversion circuit 721 of the data inversion part 720. In such a case, the data inversion circuit 721 may output the codeword without inversion of the codeword in response to the data noninversion control signal.

When the data inversion circuit 721 outputs the "n"-bit codeword with inversion or the "n"-bit codeword without inversion, "m"-bit inversion status data may be added to the "n"-bit codeword with inversion or the "n"-bit codeword without inversion. If the number "m" of bits included in the inversion status data is one and the data inversion circuit 721 outputs the "n"-bit codeword with inversion, the inversion status data may have a single datum bit "1". In contrast, if the number "m" of bits included in the inversion status data is one and the data inversion circuit 721 outputs the "n"-bit codeword without inversion, the inversion status data may have a single datum bit "0". The number "m" of bits included in the inversion status data may be two or more according to the embodiment. For example, the number "m" of bits included in the inversion status data may be two if the codeword is divided into two portions and the data inversion scheme is independently applied to each portion of the codeword. The binary data stream outputted from the data inversion circuit 721 of the data inversion part 720 may be configured to include the "k"-bit original data and "(n+m−k)"-bit metadata added to the k"-bit original data. The "(n+m−k)"-bit metadata may include the "(n−k)"-bit parity data and the "m"-bit inversion status data.

Next, referring to FIGS. 8 and 11, the "(n+m)"-bit binary data stream outputted from the data inversion part 720 may be inputted to the data separating part 731 of the data separating/merging part 730. The data separating part 731 may separate the "(n+m)"-bit binary data stream into the "k"-bit original data and the "(n+m−k)"-bit metadata and may output the "k"-bit original data and the "(n+m−k)"-bit metadata which are separated from each other. As described above, the "(n+m−k)"-bit metadata may include the "(n−k)"-bit parity data and the "m"-bit inversion status data. As described with reference to FIG. 8, the controller 700 may store the "k"-bit original data in the first memory device 500 and may store the "(n+m−k)"-bit metadata in the second memory device 600. After the "k"-bit original data and the "(n+m−k)"-bit metadata are respectively stored in the first memory device 500 and the second memory device 600, the controller 700 may update an address map in the controller 700 to set up a link between an address of the "k"-bit original data stored in the first memory device 500 and an address of the "(n+m−k)"-bit metadata stored in the second memory device 600. This is for correctly merging the "k"-bit original data and the "(n+m−k)"-bit metadata during a subsequent read operation.

Figure 12:
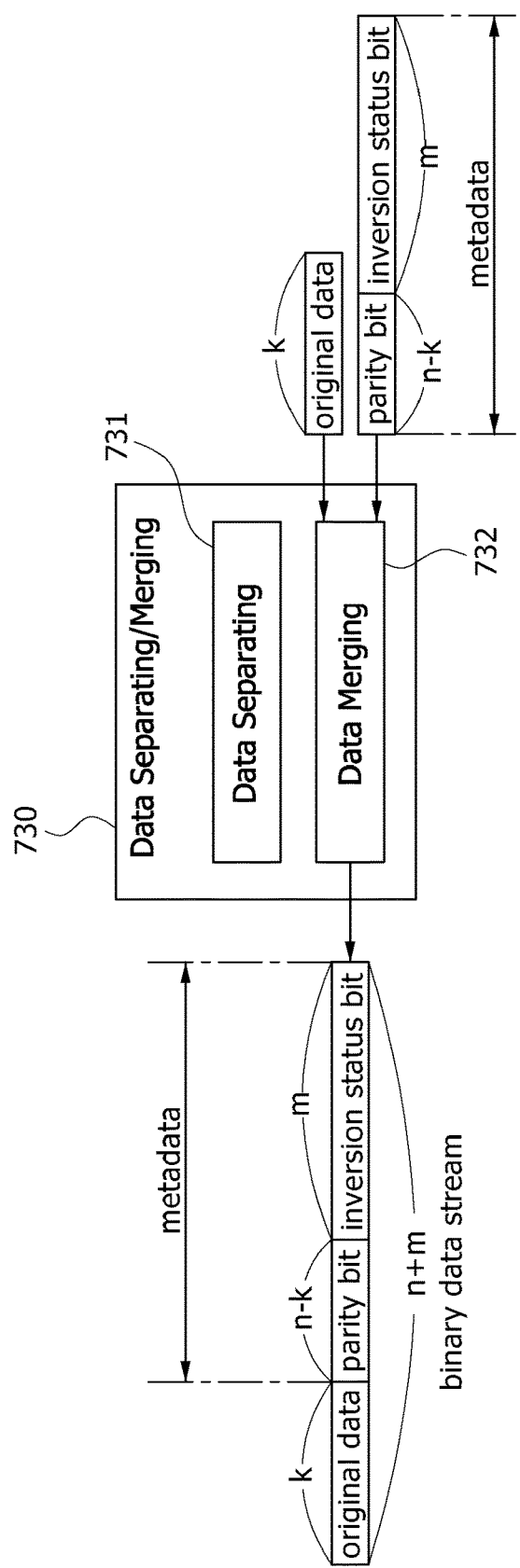
FIG. 12 is a schematic view illustrating an operation of the data separating/merging part included in the memory system of FIG. 8 during a read operation.
Figure 13:
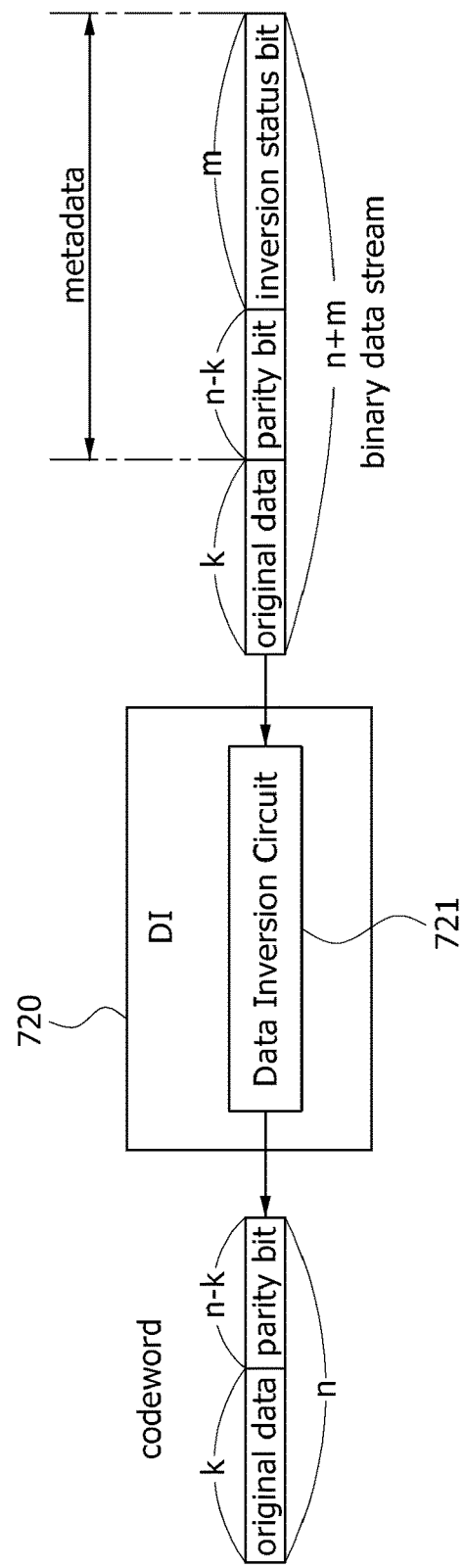
FIG. 13 is a schematic view illustrating an operation of the data inversion part included in the memory system of FIG. 8 during a read operation.
Figure 14:
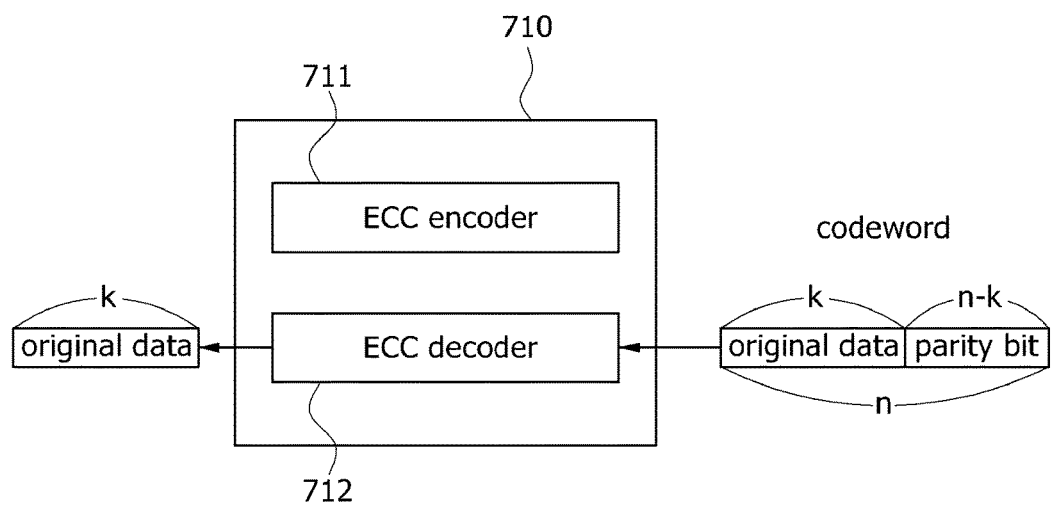
FIG. 14 is a schematic view illustrating an operation of the error correction part included in the memory system of FIG. 8 during a read operation.

FIGS. 12, 13, and 14 are schematic views illustrating a read operation of the memory system 40 shown in FIG. 8. Specifically, FIG. 12 is a schematic view illustrating an operation of the data separating/merging part 730 included in the memory system 40 during the read operation, FIG. 13 is a schematic view illustrating an operation of the data inversion part 720 included in the memory system 40 during the read operation, and FIG. 14 is a schematic view illustrating an operation of the error correction part 710 included in the memory system 40 during the read operation. First, referring to FIGS. 8 and 12, if a read command and address information are inputted to the controller 700, the controller 700 may read out the original data stored in the first memory device 500 and may read out the metadata stored in the second memory device 600. The original data read out of the first memory device 500 may be transmitted to the data merging part 732, and the metadata read out of the second memory device 600 may also be transmitted to the data merging part 732. The controller 700 may correctly read the original data and the metadata out of the first and second memories 500 and 600 using the updated address map including the linked addresses of the original data and the metadata that constitute the binary data stream which is generated during the previous write operation. The data merging part 732 may merge the original data and the metadata to generate and output an "(n+m)"-bit binary data stream. Accordingly, the "(n+m)"-bit binary data stream outputted from the data merging part 732 may include all of the original data, the parity data, and the inversion status data.

Next, referring to FIGS. 8 and 13, the "(n+m)"-bit binary data stream outputted from the data merging part 732 may be inputted to the data inversion circuit 721 of the data inversion part 720. The controller 700 may determine whether the original data or the parity data are inverted data according to the "m"-bit inversion status data of the binary data stream and may generate and supply an appropriate control signal to the data inversion circuit 721. The data inversion circuit 721 may invert all of the bit data of the "(n+m)"-bit binary data stream and may output the inverted data of the "n"-bit codeword without the inversion status data in response to the control signal, if the "n"-bit codeword corresponds to data which is inverted during the previous write operation. In contrast, if the "n"-bit codeword corresponds to data which is not inverted during the previous write operation, the data inversion circuit 721 may output the "n"-bit codeword without inversion.

Next, referring to FIGS. 8 and 14, the "n"-bit codeword outputted from the data inversion circuit 721 may be inputted to the ECC decoder 712 of the error correction part 710. The ECC decoder 712 may perform an ECC decoding operation of the "n"-bit codeword to correct erroneous bits of the "n"-bit codeword and may output "k"-bit original data of the corrected codeword. The "k"-bit original data outputted from the ECC decoder 712 may be transmitted to the host through a host interface.

Figure 15:
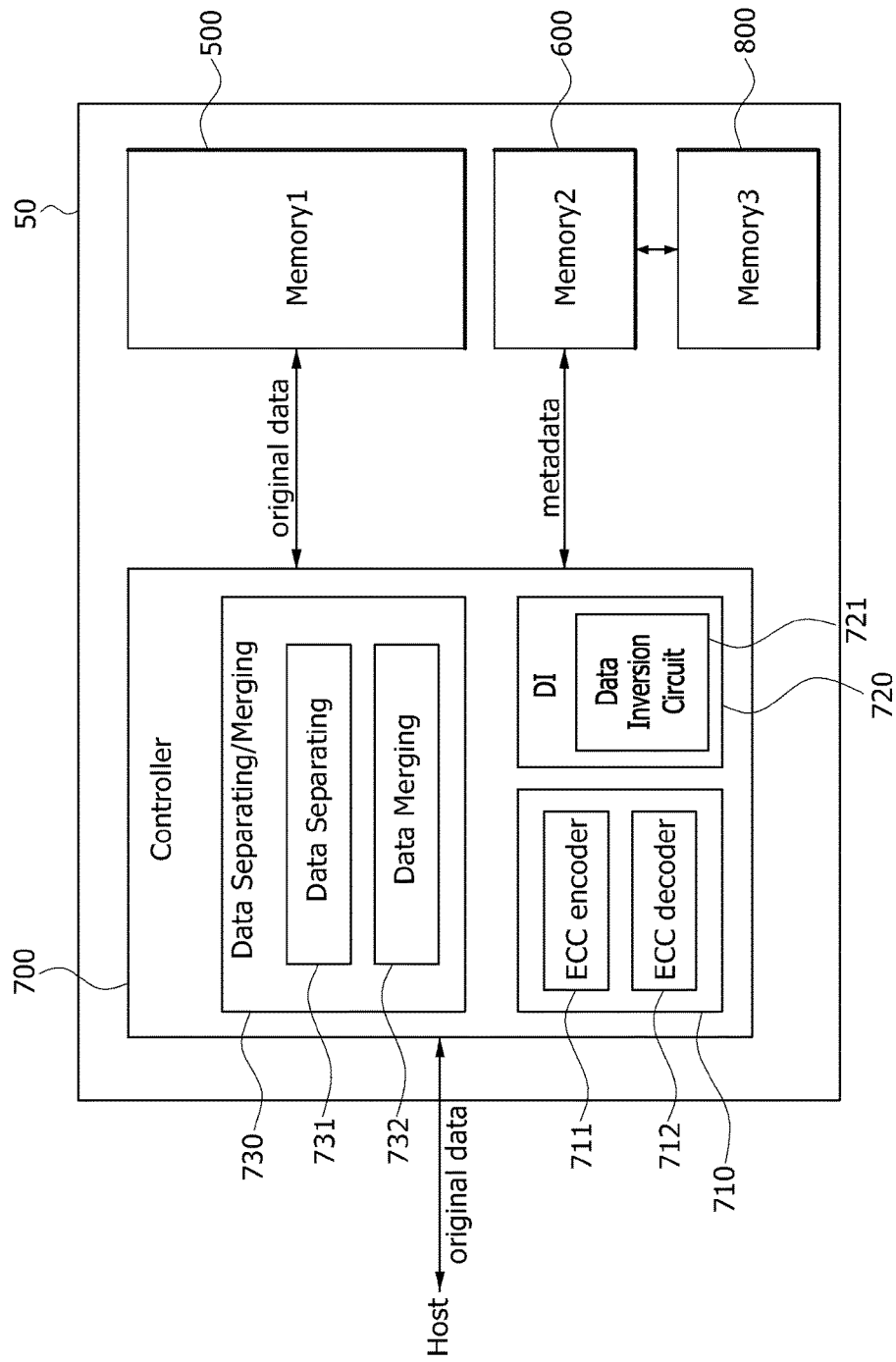
FIG. 15 is a block diagram illustrating a memory system according to still another embodiment of the present disclosure.

FIG. 15 is a block diagram illustrating a memory system 50 according to yet another embodiment of the present disclosure. In FIG. 15, the same reference numerals as used in FIG. 8 denote the same elements. Thus, to avoid duplicate explanation, description of the same elements as illustrated in FIG. 8 will be omitted or only briefly mentioned hereinafter. Referring to FIG. 15, the memory system 50 may be configured to further include a third memory device 800 as compared with the memory system 40 of FIG. 8. The third memory device 800 may be realized using a nonvolatile memory device. The third memory device 800 may be used as a backup storage device of the parity data stored in the second memory device 600. If the second memory device 600 is a volatile memory device, all of the parity data stored in the second memory device 600 may be lost when its power supply is interrupted. In the event that the memory system 50 is employed in a data server system, the power supply may be almost always applied to the data server system. However, sometimes the power supply of the data server system may be interrupted. In such a case, the controller 700 may write all of the parity data stored in the second memory device 600 into the third memory device 800 before the parity data stored in the second memory device 200 is lost. Because the third memory device 800 is a nonvolatile memory device, the parity data written into the third memory device 800 may be retained even though the power supply is interrupted. If power supply is applied to the memory system 50 again, the controller 700 may rewrite the parity data stored in the third memory device 800 into the second memory device 600.

Figure 16:
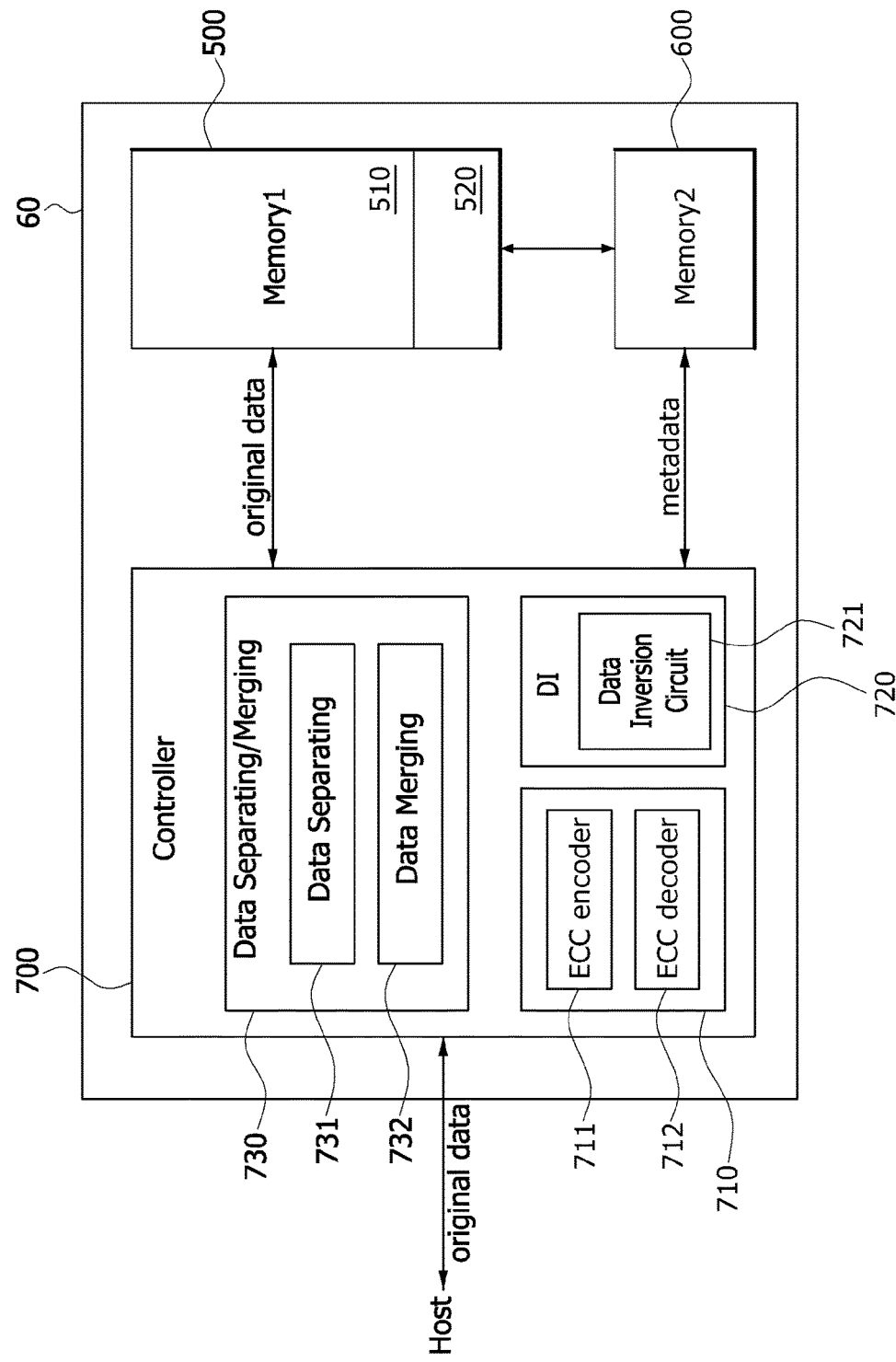
FIG. 16 is a block diagram illustrating a memory system according to yet another embodiment of the present disclosure.

FIG. 16 is a block diagram illustrating a memory system 60 according to still another embodiment of the present disclosure. In FIG. 16, the same reference numerals as used in FIG. 8 denote the same elements. Thus, to avoid duplicate explanation, description of the same elements as illustrated in FIG. 8 will be omitted or only briefly mentioned hereinafter. Referring to FIG. 16, in the memory system 60, an entire portion of the first memory device 500 may be divided into a data storage region 510 and a backup region 520. Original data may be stored in the data storage region 510. If the power supply applied to the memory system 60 is interrupted, parity data of the metadata stored in the second memory device 600 may be written into the backup region 520 of the first memory device 500. If the power supply is applied to the memory system 60 again, the parity data of the metadata stored in the backup region 520 may be rewritten into the second memory device 600.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A memory system comprising:
a first memory device;
a second memory device configured to have a write endurance which is higher than a write endurance of the first memory device; and
a controller configured to perform an error correction process on original data outputted from a host to generate a codeword including the original data and parity data and configured to separate the codeword into the original data and the parity data to write the separated original data into the first memory device and to write the separated parity data into the second memory device,
wherein the first memory device includes:
a data storage region configured to store the original data; and
a backup region configured to store the parity data stored in the second memory device.

2. The memory system of claim 1, wherein the first and second memory devices are nonvolatile memory devices.

3. The memory system of claim 1, wherein the first memory device is a nonvolatile memory device and the second memory device is a volatile memory device.

4. The memory system of claim 1,
wherein the controller includes an error correction part; and
wherein the error correction part includes:
an error correction code (ECC) encoder configured to perform an ECC encoding operation of the original data inputted to the ECC encoder during a write operation to generate the codeword; and
an ECC decoder configured to perform an ECC decoding operation of a codeword inputted to the ECC decoder during a read operation to generate corrected original data.

5. The memory system of claim 1,
wherein the controller includes a data separating/merging part; and
wherein the data separating/merging part include:
a data separating part configured to separate the codeword into the original data and the parity data to output the separated original data and the separated parity data; and
a data merging part configured to merge the original data and the parity data, which are separated from each other and inputted to the data merging part, to generate a merged codeword.

6. The memory system of claim 1, further comprising a third memory device configured to act as a backup storage device and configured to store the parity data stored in the second memory device,
wherein the third memory device is a nonvolatile memory device.

* * * * *